US007005865B2

(12) United States Patent
Yakabe et al.

(10) Patent No.: US 7,005,865 B2
(45) **Date of Patent: *Feb. 28, 2006**

(54) CIRCUIT AND METHOD FOR IMPEDANCE DETECTION

(75) Inventors: Masami Yakabe, Tokyo (JP); Naoki Ikeuchi, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 16 days.

This patent is subject to a terminal disclaimer.

(21) Appl. No.: 10/488,679

(22) PCT Filed: Sep. 6, 2002

(86) PCT No.: PCT/JP02/09137

§ 371 (c)(1), (2), (4) Date: Oct. 14, 2004

(87) PCT Pub. No.: WO03/023420

PCT Pub. Date: Mar. 20, 2003

(65) Prior Publication Data

US 2005/0035771 A1 Feb. 17, 2005

(30) Foreign Application Priority Data

Sep. 6, 2001 (JP) ............................ 2001-270877

(51) Int. Cl.
*G01R 27/26* (2006.01)

(52) U.S. Cl. .................................. 324/686; 324/76.79

(58) Field of Classification Search ............ 73/514.32; 324/658, 661, 681, 76.79, 686
See application file for complete search history.

(56) References Cited

U.S. PATENT DOCUMENTS 4,918,376 A * 4/1990 Poduje et al. ............... 324/663
6,145,384 A * 11/2000 Ikeda et al. .................... 73/780
6,373,264 B1 * 4/2002 Matsumoto et al. ........ 324/667
6,753,691 B1 * 6/2004 Lasalandra et al. ......... 324/686

FOREIGN PATENT DOCUMENTS

DE 32 21 800 12/1983
JP 09-280806 10/1997
JP 2001-324520 11/2001
JP 2002-022785 1/2002

(Continued)

OTHER PUBLICATIONS

Supplementary European Search Report, EPO Form 1503 03.82 (P04C04) dated Jun. 14, 2005 (1page).

(Continued)

*Primary Examiner*—Walter Benson
(74) *Attorney, Agent, or Firm*—Finnegan, Henderson, Farabow, Garrett & Dunner, L.L.P.

(57) ABSTRACT

An electrostatic capacitance detection circuit 10 comprises a DC voltage generator 11, an operational amplifier 14 of which non-inverting input terminal is connected to specific potential, an impedance converter 16, a resistance (R1) 12 connected between the DC voltage generator 11 and an inverting input terminal of the operational amplifier 14, a resistance (R2) 13 connected between the inverting input terminal of the operational amplifier 14 and an output terminal of the impedance converter 16, and a capacitor 15 connected between an output terminal of the operational amplifier 14 and an input terminal of the impedance converter 16. A capacitor to be detected 17 is connected between the input terminal of the impedance converter 16 and specific potential.

15 Claims, 8 Drawing Sheets

FOREIGN PATENT DOCUMENTS

| | | |
|---|---|---|
| JP | 2002-022786 | 1/2002 |
| JP | 2002-157671 | 5/2002 |
| WO | WO 94/23547 | 10/1994 |
| WO | WO 99/38019 | 7/1999 |
| WO | WO 99/38020 | 7/1999 |

OTHER PUBLICATIONS

Annex to the European Search Report, EPO Form P0459 dated Jun. 14, 2005 (1page). For Application No. EP 02 76 7921

* cited by examiner

--PRIOR ART--

CIRCUIT AND METHOD FOR IMPEDANCE DETECTION

TECHNICAL FIELD

The present invention relates to a circuit and a method that detect impedance and electrostatic capacitance, especially relates to the circuit and the method that detect very small impedance and capacitance with high accuracy.

BACKGROUND ART

As a prior art of an electrostatic capacitance detection circuit, that described in Japanese Laid-Open Patent Application H09-280806 gazette can be cited. FIG. 1 is a circuit diagram that shows this electrostatic capacitance detection circuit. In this detection circuit, a capacitive sensor 92 comprised of electrodes 90 and 91 is connected to an inverting input terminal of an operational amplifier 95 via a signal line 93. And a capacitor 96 is connected between an output terminal of this operational amplifier 95 and the said inverting input terminal, and further an AC voltage Vac is applied to a non-inverting input terminal. Also, the said signal line 93 is wrapped up by a shield line 94 and shielded electrically against disturbance noise. And this shield line 94 is connected to the non-inverting input terminal of the operational amplifier 95. Output voltage Vd is obtained from an output terminal of the said operational amplifier 95 via a transformer 97.

In this detection circuit, the inverting input terminal and the non-inverting input terminal of the operational amplifier 95 are in an imaginary short status, so that the signal line 93 connected to the inverting input terminal and the shied line 94 connected to the non-inverting input terminal have the almost same potential. Thereby, the signal line 93 is guarded by the shield line 94, that is, stray capacitance between the signal line 93 and the shield line 94 is canceled, and the output voltage Vd, which is unlikely to be affected by the stray capacitance, can be obtained.

According to this kind of conventional art, when capacitance of the capacitive sensor 92 is big to some extend, it is indeed possible to obtain accurate output voltage Vd, which is not affected by the stray capacitance between the signal line 93 and the shield line 94. However, when very small capacitance, which equals to or is less than an order of several pF or fF (femtofarad), is detected, an error is increased.

Also, depending on a frequency of the AC voltage Vac applied, a subtle displacement of a phase and amplitude consequently arises between the voltage of the inverting input terminal and that of the non-inverting input terminal, which are in the imaginary short status, due to a tracking error in the operational amplifier 59, and thereby the detection error becomes bigger.

On the other hand, for lightweight and small audio communication devices represented by a mobile phone or the like, there has been a demand of a compact amplifier circuit that sensitively and faithfully transforms sounds detected by a capacitive sensor such as a capacitor microphone into an electric signal. If it is possible to accurately detect very small capacitance that equals to or is less than several pF or fF and/or its change, a high performance microphone that can detect sounds with a very high level of sensitivity and fidelity is realized, and thereby performance for picking up sounds by the audio communication devices such as a mobile phone will make rapid progress.

This invention is devised in view of the above-mentioned situation, and aims at providing an impedance detection circuit, an electrostatic capacitance detection circuit and the like that are capable of accurately detecting very small capacitance change, and suitable to detect impedance, such as a capacitive sensor including a capacitor microphone used for lightweight and compact audio communication devices.

DISCLOSURE OF INVENTION

In order to achieve above objectives, the electrostatic capacitance detection circuit according to the present invention is an impedance detection circuit that outputs a detection signal corresponding to impedance of an impedance element to be detected, comprising: an impedance converter of which input impedance is high and output impedance is low; a first capacitive impedance element; a first operational amplifier; a DC voltage generator that applies DC voltage to the first operational amplifier; and a signal output terminal that is connected to an output of the first operational amplifier, wherein an input terminal of the impedance converter is connected to one end of the impedance element to be detected and one end of the first impedance element, the first impedance element and the impedance converter are included in a negative feedback loop of the first operational amplifier, and the impedance element to be detected and the impedance detection circuit are located adjacently.

Also, the electrostatic capacitance detection circuit according to the present invention is an impedance detection circuit that outputs a detection signal corresponding to impedance of an impedance element to be detected, comprising: an impedance converter of which input impedance is high and output impedance is low; a first capacitive impedance element; a first operational amplifier; a DC voltage generator that applies DC voltage to the first operational amplifier; and a signal output terminal that is connected to an output of the first operational amplifier, wherein an input terminal of the impedance converter is connected to one end of the impedance element to be detected and one end of the first impedance element, the first impedance element and the impedance converter are included in a negative feedback loop of the first operational amplifier, and the impedance element to be detected, the first impedance element and the impedance converter are located closely.

In this patent document, “closely” means that the stray capacitance of the signal line is in a situation where the capacitance does not exceed ten times as much as a bigger value of either the capacitance value of the impedance to be detected or the capacitance value of the first capacitive impedance element. It was found through experiences that the electrostatic capacitance detection circuit of the present invention can prevent its detection sensitivity from being highly deteriorated when the stray capacitance of the signal line is set to have a capacitance value that does not exceed ten times as much as the capacitance value of the element connected. This stray capacitance of the signal line is measurable if it is measured under a situation where the impedance to be detected, the first impedance element and the impedance converter are not connected to the signal line. In this patent document, a status where an object is in contact with other object side by side under the above condition for being closely is called as “adjacently”.

Also, an impedance detection method and an electrostatic capacitance detection method according to the present invention is an impedance detection method that outputs a detection signal corresponding to impedance of an impedance element to be detected, comprising steps for: connecting a first capacitive impedance element between an output terminal of an operational amplifier and an input terminal of an impedance converter; connecting the impedance element to be detected between the input terminal of the impedance converter and specific potential; applying DC voltage to one input terminal of the operational amplifier via a resistance, and other input terminal of the operational amplifier is connected to specific potential; outputting voltage that comes out at the output terminal of the operational amplifier as a detection signal; and connecting the impedance element to be detected, the impedance converter and the first impedance element closely.

As a specific example, the electrostatic capacitance detection circuit is structured to comprise a DC voltage generator, a operational amplifier of which non-inverting input terminal is connected to specific potential, an impedance converter, a resistance (R2) connected between an inverting input terminal of the operational amplifier and an output terminal of the impedance converter, a capacitive impedance element connected between the output terminal of the operational amplifier and the input terminal of the impedance converter. An impedance to be detected is located adjacently to this impedance detection circuit, or set closely to the impedance detection circuit at a short distance that does not make the stray capacitance of the signal line exceed ten times as much as maximum capacitance of an element connected, and connected between the input terminal and the specific potential. The specific potential in the example here indicates either certain standard potential, specific DC potential, ground potential or a floating status, whichever suitable is selected according to a style of an embodiment. Also, a resistance (R1) connected between the DC voltage generator and the inverting input terminal of the operational amplifier may further be added.

According to the above structure, a certain voltage is applied to the impedance to be detected, most of electric current that flows through the impedance to be detected is further sent to the impedance element, and then a signal corresponding to the impedance of the impedance to be detected is output from a signal output terminal.

A resistance may be connected in parallel with the impedance element.

Also, one end of the impedance to be detected and the input terminal of the impedance converter may be connected each other by a signal line covered with a shielding material, and a guard voltage applying unit that applies specific voltage to the shielding material may be added. Here, the specific potential means some discretional regular potential, preferably a ground, but it may be the same potential as that of the voltage of the signal line. Actions of the circuit are stabilized by the specific voltage applied to the shielding material.

The guard voltage applying unit is, for example, a unit that generates a certain voltage using output voltage of the DC voltage generator or output voltage of the impedance converter as an input, or a unit that connects the shielding material to the ground.

Also, the impedance converter may be made up of a voltage follower, or a voltage amplifier of which voltage gain is less than or more than 1. Then, when an input side of the impedance converter is made up of a circuit comprising MOSFET, the input impedance may further be enhanced.

As a practical application of the present invention, it is preferable that the impedance to be detected is a capacitance type of sensor that detects a physical quantity according to a fluctuation in the capacitance, that the electrostatic capacitance detection circuit as the impedance detection circuit is formed on a printed circuit board or a silicon substrate, and that the capacitance type of sensor and the board are fixed. As a further specific example, it is possible that a capacitor microphone is adopted as the impedance to be detected, that the electrostatic capacitance detection circuit is embodied by an IC, that the capacitor microphone and the IC are integrated into one and put in a shield box as a microphone used for a mobile phone or the like. In this case, the capacitor microphone and the IC are fixed adjacently and connected with a conductive board, a wiring pattern, a wire bonding or the like.

BEST MODE FOR CARRYING OUT THE INVENTION

The following provides a detailed explanation of embodiments of the present invention with reference to diagrams.

(First Embodiment)

Figure 1:
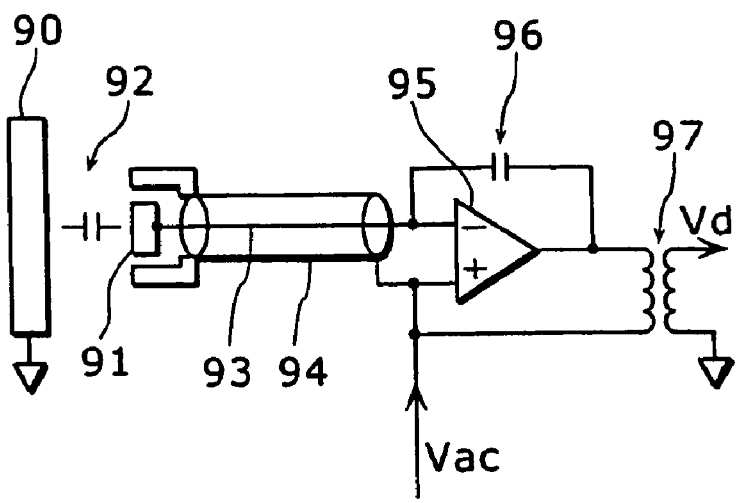
FIG. 1 is a circuit diagram showing a conventional electrostatic capacitance detection circuit.
Figure 2:
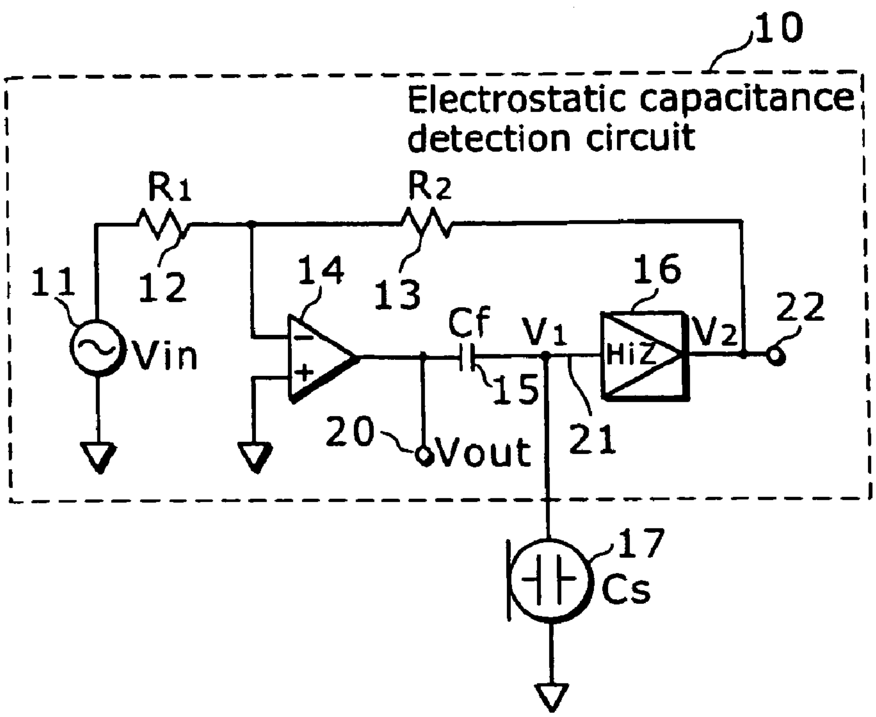
FIG. 2 is a circuit diagram of an electrostatic capacitance detection circuit according to a first embodiment of the present invention.

FIG. 2 is a circuit diagram of an impedance detection circuit according to a first embodiment of the present invention. In this diagram, a capacitor to be detected 17 (i.e. a capacitance type sensor that detects various types of physical quantities using a fluctuation in the electrostatic capacitance Cs such as a capacitor microphone in this example.), which is a subject for detection as an impedance to be detected, is connected to an electrostatic capacitance detection circuit 10 as the impedance detection circuit.

This electrostatic capacitance detection circuit 10 comprises an DC voltage generator 11 that generates AC voltage, a resistance (R1) 12, a resistance (R2) 13, an operational amplifier 14, an impedance element 15 (a capacitor with capacitance Cf in this example) and an impedance converter 16, and outputs a detection signal (voltage V out) corresponding to a temporal change in electrostatic capacitance of the capacitor 17 from a signal output terminal 20. The "temporal change" here includes changes with respect to a frequency or a pulse, gradual changes, random changes with time, and so on, and it may not necessarily indicate periodicity.

One end of the DC voltage generator 11 is connected to specific potential (a ground in this example), and other end (an output terminal) of that generates a certain DC voltage Vin. The resistance (R1) 12 is connected between the output terminal of the DC voltage generator 11 and an inverting input terminal of the operational amplifier 14. The operational amplifier 14 is a voltage amplifier of which input impedance and open loop gain are extremely high, a non-inverting input terminal here is connected to specific potential (the ground in this example), and the non-inverting input terminal and the inverting input terminal are in an imaginary short status. In a negative feedback loop of the operational amplifier 14, which is from an output terminal to the inverting input terminal of the operational amplifier 14, the capacitor 15, the impedance converter 16 and the resistance (R2) 13 are connected in series in this order.

The impedance converter 16 is a voltage amplifier of which input impedance is extremely high, output impedance is extremely low, and voltage gain is A times. An input terminal 21 of this impedance converter 16 is connected to one end of the capacitor 17, and other end of the capacitor 17 is connected to the specific potential (the ground in this example). An output terminal of the operational amplifier 14 is connected to an output signal of this electrostatic capacitance detection circuit 10, i.e. the signal output terminal 20 for outputting a detection signal corresponding to a change in the capacitance value of the capacitor 17. A variable A indicated for A times or the like in this patent document shows any real number other than zero.

Actions of the electrostatic capacitance detection circuit 10 structured above are as follows.

Regarding an inverting amplification circuit comprising the resistance (R1) 12, the resistance (R2) 13 and the operational amplifier 14 and the like, both of the input terminals of the operational amplifier 14 are in the imaginary short status and in the same potential (e.g. 0 V), the impedance thereof is extremely high, and no electric current flows through, so that the electric current passed through the resistance (R1) 12 becomes Vin/R1. And, because all of the electric current is sent to the resistance (R2) 13, the following expression becomes effective when output voltage of the impedance converter 16 is V2.

$$Vin/R1=-V2/R2$$

When summarizing this, the output voltage V2 of the impedance converter 16 can be expressed by the following expression.

$$V2=-(R2/R1)\cdot Vin \qquad \text{(Expression 1)}$$

Also, because the voltage gain of the impedance converter 16 is A, the input voltage V1 is as follows from a relationship between the input voltage (voltage of the input terminal 21) V1 and the output voltage (voltage of the output terminal 22) V2.

$$V1=(1/A)\cdot V2 \qquad \text{(Expression 2)}$$

By the way, when the capacitor 17 is a capacitor microphone or the like, the capacitance Cs thereof is changed by a frequency of sound input. Here, when an electric charge corresponding to the change, which is sent from the operational amplifier 14 to the capacitor 15, i.e. from the capacitor 15 to the capacitor 17, is ΔQ (i.e. for a change in the capacitance of the capacitor 17), all of the electric charge Q is sent to the capacitor 17 because the input impedance of the impedance converter 16 is extremely high, and it becomes V1=ΔQ/ΔCs. Therefore, Δ Vout for the change in the voltage Vout of the detection signal, which is output from the signal output terminal 20, is as follows.

$$\Delta Vout=(\Delta Cs/Cf)\cdot V1 \qquad \text{(Expression 3)}$$

When V2 is deleted from the above expressions 1 and 2, the following expression is obtained.

$$V1=-(R2/R1)\cdot(Vin/A) \qquad \text{(Expression 4)}$$

When this V1 is assigned to the above expression 3, the following expression is obtained.

$$\begin{aligned} Vout &= -(1/Cf)\cdot(R2/R1)\cdot(Vin/A)\cdot\Delta Cs \\ &= k\cdot\Delta Cs \end{aligned} \qquad \text{(Expression 5)}$$

Where $$K=-(1/Cf)\cdot(R2/R1)\cdot(Vin/A) \qquad \text{(Expression 6)}$$

That is, Δ Vout for the change in the output voltage Vout of the detection signal becomes a value in proportion to Δ Cs for the change in the capacitance Cs of the capacitor 17. Therefore, a signal corresponding to the sound input to the capacitor microphone can be obtained by extracting only Δ Vout, which is the DC component of the detection signal output from this electrostatic capacitance detection circuit 10. Then, it is possible to largely amplify the net signal corresponding to the sound (the voltage corresponding to Δ Cs), and a highly sensitive microphone can be realized.

A proportionality constant k shown in the above expression 6 does not contain an item that depends on the frequency (the sound frequency), and is a fixed value. Therefore, this electrostatic capacitance detection circuit 10 does not depend on the sound frequency, and with a fixed gain, it outputs a faithful voltage signal corresponding to loudness of the sound. Here, actions of the capacitor 17 have been examined from a viewpoint of voltage. When it is analyzed from an angle of electric current for better understanding, it is as follows.

Suppose the capacitance of the capacitor 17 has been changed temporally such as follows.

$$Cs=Cd+\Delta C\sin\omega ct \qquad \text{(Expression 7)}$$

Here, Cd is standard capacitance originally and basically held by the capacitor 17, Δ C is a peak value of the change, and ω c is a frequency that changes the capacitance being detected for the capacitor 17. At this point, the electric current that flows to the capacitor 17 is as follows:

(Expression 8)

Because all of this electric current flows to the capacitor 15:

(Expression 9)

Here, since each of the electric current in the expressions 8 and 9 is identical, (Expression 10)

From the expressions 1 and 2, the expression 10 can be expressed as follows.

(Expression 11)

Again, the change of the capacitor 17 is supposed to be output.

Also, since this electrostatic capacitance detection circuit 10 is operated by a DC drive (the DC voltage generator 11), it is steadily functioned when compared with a case of an AC drive so that noise or the like can be restrained. Furthermore, parts for the DC transmitter, etc. become unnecessary, and thereby size of the circuit can be reduced.

FIG. 3 is a specific circuit example of the impedance converter 16 in the electrostatic capacitance detection circuit 10 shown in FIG. 2. FIG. 3A shows a voltage follower 16*a* using an operational amplifier 30. An inverting input terminal and an output terminal of the operational amplifier 30 are short-circuited. The impedance converter 16, of which input impedance is extremely high and voltage gain A becomes 1, can be obtained by making a non-inverting input terminal of this operational amplifier 30 be an input of the impedance converter 16, and making the output terminal of the operational amplifier 30 be an output of the impedance converter 16.

Figure 3A:
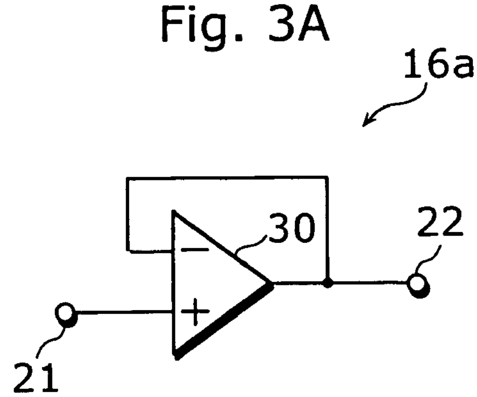
FIG. 3 shows a specific circuit example of an impedance converter in the electrostatic capacitance detection circuit shown in FIG. 2.
Figure 3B:
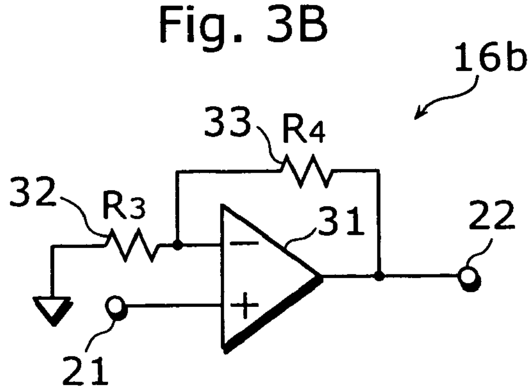

FIG. 3B shows a non-inverting amplifier circuit 16*b* using an operational amplifier 31. A resistance (R3) 32 is connected between an inverting input terminal of the operational amplifier 31 and specific potential, and a feedback resistance (resistance (R4) 33) is connected between the inverting input terminal and the output terminal of the operational amplifier 31. The impedance converter 16, of which input impedance is extremely high and voltage gain A becomes (R3+R4)/R3, can be obtained by making a non-inverting input terminal of this operational amplifier 31 be an input of the impedance converter 16, and making the output terminal of the operational amplifier 31 be an output of the impedance converter 16.

Figure 3C:
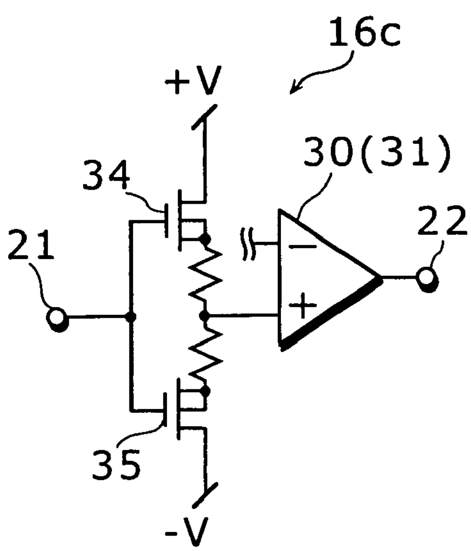

FIG. 3C shows a circuit 16*c* where a buffer in CMOS structure is added to an input side of the operational amplifier as shown in FIG. 3A or B. As illustrated in the diagram, N type MOSFET34 and P type MOSFET35 are connected in series between negative and positive power supplies via a resistance, and an output of the buffer is connected to the input of the operational amplifier 30 (or 31). The impedance converter 16, of which input impedance is extremely high, can be obtained by making the input of this buffer be an input of the impedance converter 16, and making the output terminal of the operational amplifier be an output of the impedance converter 16.

Figure 3D:
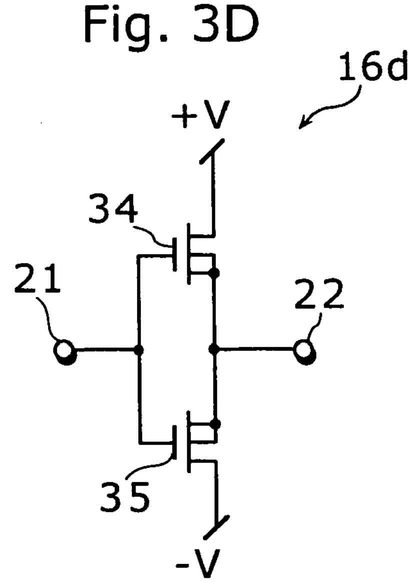

FIG. 3D shows a circuit 16*d* that is like a buffer at the input side of FIG. 3C. As illustrated in the diagram, N type MOSFET 34 and P type MOSFET 35 are connected in series between the positive and negative power supplies, and the output is made from a connection point of both MOSFET.

Figure 3E:
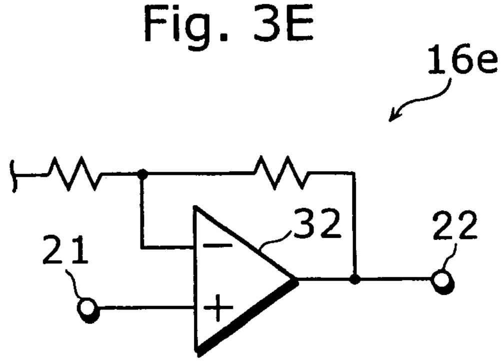

FIG. 3E is a circuit where a non-inverting input of an operational amplifier 32 is made to be an input of the impedance converter, and an output and the inverting input of the operational amplifier 32 are connected each other via a resistance. As shown in FIGS. 3D and E, having such structure realizes the impedance converter 16 of which input impedance is extremely high.

According to an experiment related to the present invention, in the electrostatic capacitance detection circuit shown in FIG. 2, for example, if the stray capacitance of the signal line exceeds 200 pF when original electrostatic capacitance of Cs (an impedance to be detected: a microphone in the present embodiment) is 20 pF, the detection sensitivity becomes much worse. Also, when the said Cs is checked with a few other electrostatic capacitance values, their results tend to be the same.

Additionally, both of the capacitance Cf, which is the first impedance element, and the capacitor Cs are a capacitance element connected to the signal line in this circuit, so that the same result as above is expected for calculation of both of the elements.

From these experimental results and experiences, it was found out that good detective sensitivity is secured when the impedance to be detected, the first impedance element and the impedance converter are located closely in a way that the stray capacitance of the signal line does not exceed ten times as much as the capacitance value of the relevant Cs or Cf.

(Second Embodiment)

Next, the following describes an impedance detection circuit according to a second embodiment of the present invention.

Figure 4:
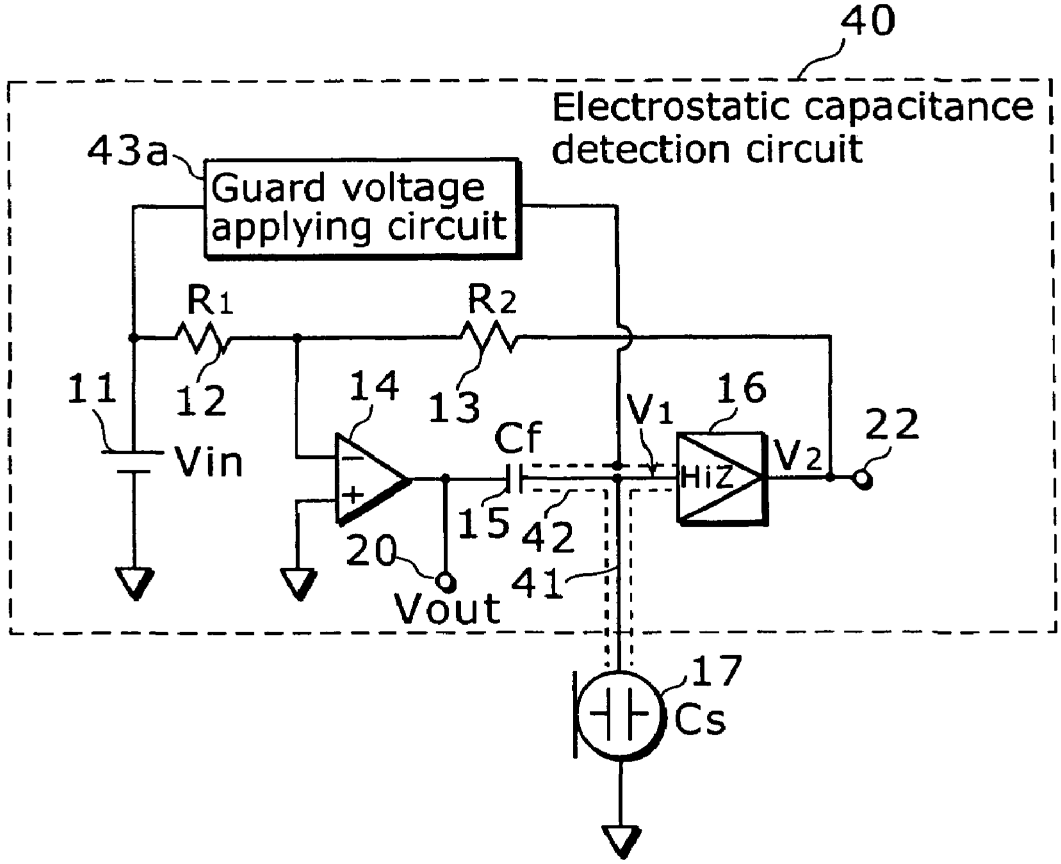
FIG. 4 is a circuit diagram of an electrostatic capacitance detection circuit according to a second embodiment of the present invention.

FIG. 4 is a circuit diagram of an electrostatic capacitance detection circuit 40 as the impedance detection circuit according to the second embodiment of the present invention. This electrostatic capacitance detection circuit 40 is equivalent to what a guarding function is added to the electrostatic capacitance detection circuit 10 according to the first embodiment. That is, as a cable to connect the capacitor 17 with the electrostatic capacitance detection circuit 40, a signal line 41 (a coaxial cable) covered with a shielding line 42 is used, and additionally a guard voltage applying circuit 43*a* for applying guard voltage, of which potential is the same as that of the signal line 41, is added to the shielding line 42 of the coaxial cable.

By making the guard voltage applying circuit 43*a* be connected between the output terminal of the DC voltage generator 11 and the shielding line 42, receiving the output voltage Vin of the DC voltage generator 11 as an input, and amplifying the voltage (or dividing the voltage) with a certain pre-adjusted voltage gain, the guard voltage applying circuit 43*a* serves as a DC voltage amplifier that generates guard voltage, of which potential is the same as that of the voltage of the signal line 41, and that outputs and applies the guard voltage to the shielding line 42. The voltage gain of this guard voltage applying circuit 43*a* is specifically V1/Vin, that is, as seen from the above expression 4, adjusted to $(-R2/R1)\cdot(1/A)$.

Having such structure keeps the signal line 41 and the shielding line 42 in the same potential all the time, and cancels capacitance (stray capacitance) between them, so that any undesirable situation, which the stray capacitance is added up to the capacitance of the capacitor 17 as a measurement error, can be avoided, any disturbance noise mixed in the signal line 41 can be shielded by the shielding line 42, and thereby more accurate and stable capacitance detection becomes possible.

Figure 5:
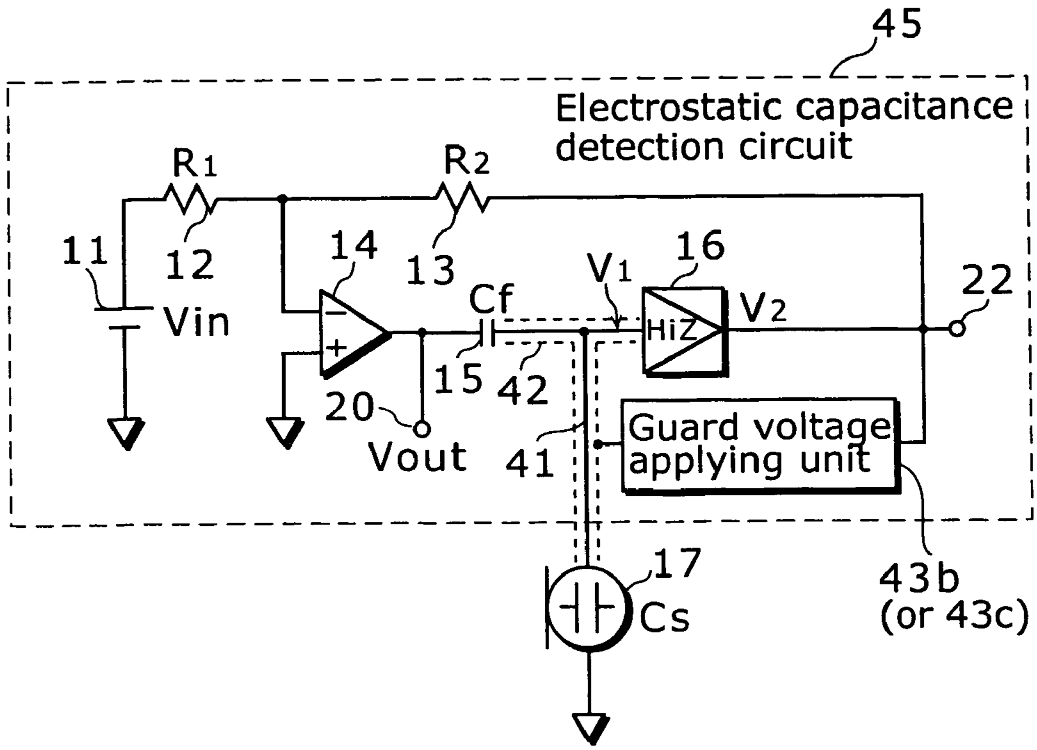
FIG. 5 is a circuit diagram related to a variation of the electrostatic capacitance detection circuit shown in FIG. 4.

A connection point of the guard voltage applying circuit 43*a* that applies guard voltage to the shielding line 42 is not limited to an area between the DC voltage generator 11 and the shielding line 42 shown in FIG. 4, and it may be located to an area between the output terminal of the impedance converter 16 and the shielding line 42, for example, like the electrostatic capacitance detection circuit 45 shown in FIG. 5. At this time, by receiving the output voltage V2 of the impedance converter 16 as an input and amplifying it with a certain voltage gain (1/A), a guard voltage applying circuit 43*b* (or 43*c*) may be adjusted to generate guard voltage V1 and apply the voltage to the shielding line 42.

By the way, if the guard voltage applying circuit is only limited to DC applying, the cancellation effect of the stray capacitance cannot be expected. In such a case, it is effective to have ground connection in simple structure where any disturbance noise is not easily mixed in.

Figure 6A:
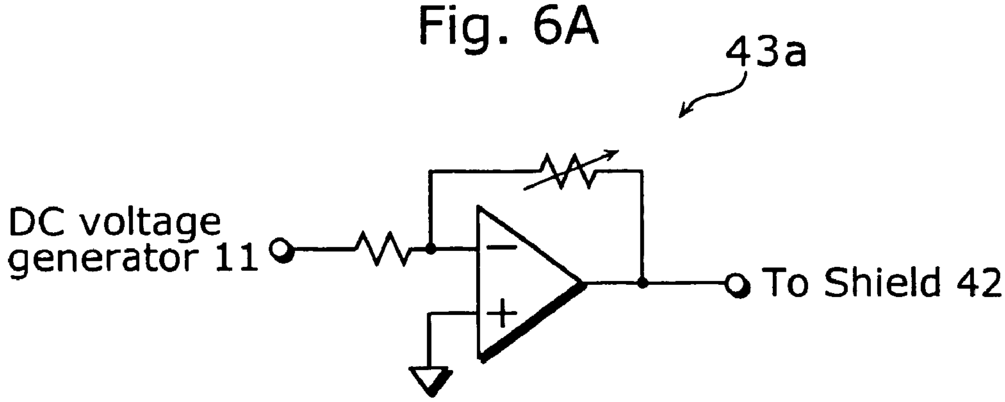
FIG. 6 shows specific circuit examples of a guard voltage applying circuit shown in FIGS. 4 and 5.
Figure 6B:
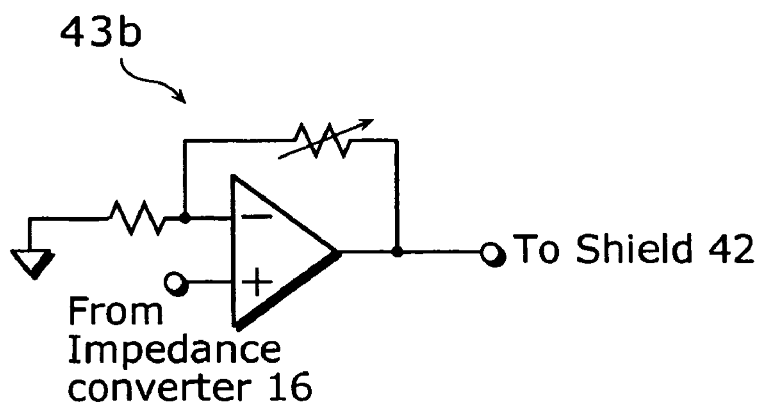
Figure 6C:
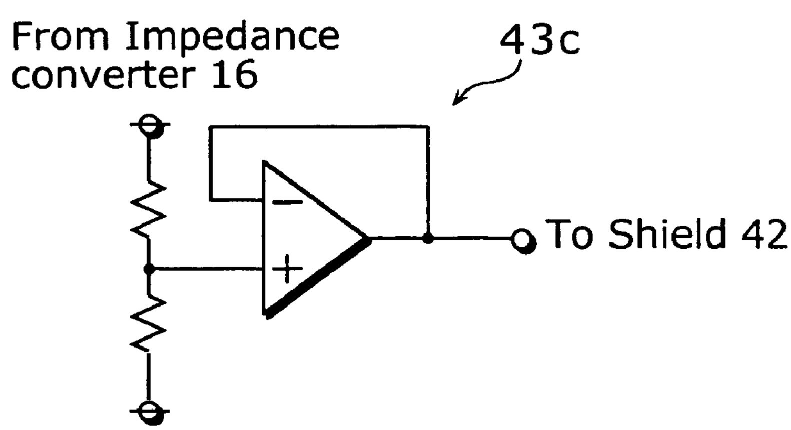

FIG. 6 shows specific circuit examples of the guard voltage applying circuits 43_a~c_ indicated in FIGS. 4 and 5. The guard voltage applying circuit 43_a_ shown in FIG. 6A is an inverting amplification circuit having its variable resistance as a feedback resistance. The above voltage gain can be obtained by adjusting the resistance value of the feedback resistance, and the guard voltage, of which potential is the same as that of the signal line 41, can be generated. The guard voltage applying circuit 43_b_ shown in FIG. 6B is a non-inverting amplification circuit composed of two resistances and one operational amplifier. The guard voltage applying circuit 43_c_ shown in FIG. 6C is a voltage follower composed of two resistances and one operational amplifier. The guard voltage, of which potential is the same as that of the signal line 41 in FIG. 5, can also be generated by adjusting the values of the resistance in these FIGS. 6B and C.

In case of operational errors, tracking errors or the like, there is a possibility to reduce them when the gain A is set to 1. Therefore, A=1 is preferable.

As a practical application of the electrostatic capacitance detection circuit of the present invention used for electric devices, it can be considered that the impedance to be detected is a sensor that detects a physical quantity according to a fluctuation in the impedance, that the impedance detection circuit is formed on a printed circuit board or a silicon substrate, and that the sensor and the board or the substrate are fixed and integrated into one. To be more specific, it is possible that a capacitor microphone is adopted as the impedance to be detected, that the electrostatic capacitance detection circuit is embodied by an IC, that the capacitor microphone and the IC are integrated into one and put in a shield box as a microphone used for a mobile phone or the like.

Figure 7:
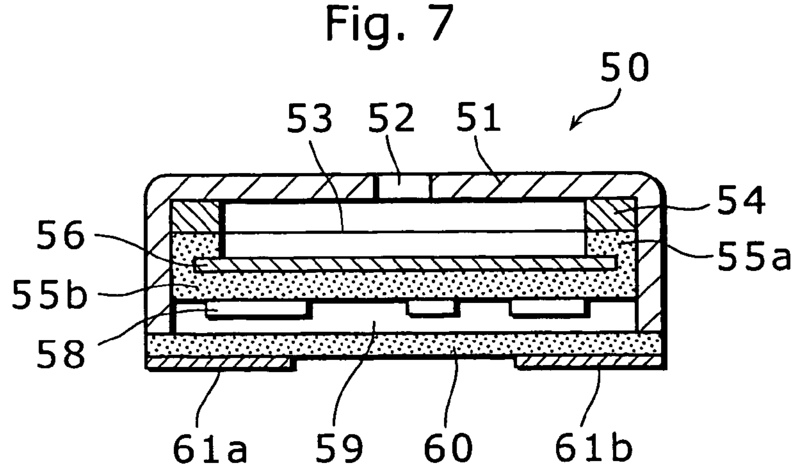
FIG. 7 is a diagram showing a practical example of the electrostatic capacitance detection circuit of the present invention used for electric devices (a cross section diagram of a microphone).

FIG. 7 is a diagram showing a practical example to use the electrostatic capacitance detection circuit according to the first embodiment for an electric device. Here, it shows a cross section diagram of a microphone 50 used for a mobile phone or the like which comprises a capacitor microphone and an electrostatic capacitance detection circuit that are integrated into one. This microphone 50 comprises a lid cover 51 having a sound hole 52, an oscillating film 53 that oscillates with sounds, a ring 54 that fixes the oscillating film 53, a spacer 55_a_, a fixed electrode 56 set up against the oscillating film 53 via the spacer 55_a_, an isolation board 55_b_ that supports the fixed electrode 56, an IC chip 58 forming the electrostatic capacitance detection circuit according to the above embodiment, which is fixed on a backside of the isolation board 55_b_, an IC package 59 that molds the IC chip 58, external electrodes 61_a_ and 61_b_ that are connected by the IC chip 58, a wire bonding, a contact hole, and the like.

The oscillating film 53, which is one side of the electrodes that forms the capacitor, is connected to specific potential (a ground in this example), and the fixed electrode 56, which is the other side of the electrodes, is connected to a circuit of the IC chip 58 via an electric conductor such as an aluminum board or a wire bonding. Capacitance and a change in the capacitance of the capacitor comprising the oscillating film 53 and the fixed electrode 56 are detected by the electrostatic capacitance detection circuit in the IC chip 58 located adjacently via the isolation board 55_b_, transformed into an electric signal, and output from the external electrodes 61_a_ and 61_b_, or the like. The lid cover 51, which is made from a metal such as aluminum, serves as a role of a shield box that shields any disturbance noise mixed into the inner capacitors 53 and 56, and the IC chip 58 with a conductive film (not shown) formed on an upper surface of the isolation board 60. In this example, the fixed electrode 56 is connected to the circuit, and the oscillating film 53 is connected to specific potential. However, the oscillating film 53 may be connected to the circuit, and the fixed electrode 56 may be connected to the specific potential. But, the former case is preferable from past experiences.

Figure 8A:
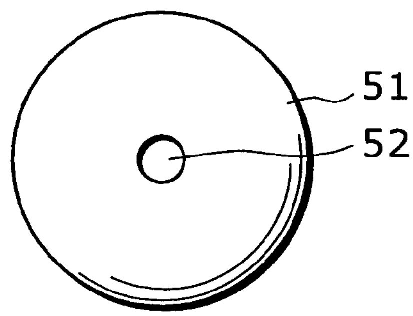
FIG. 8A is a plain diagram showing an external outline of the microphone shown in FIG. 7.
Figure 8B:
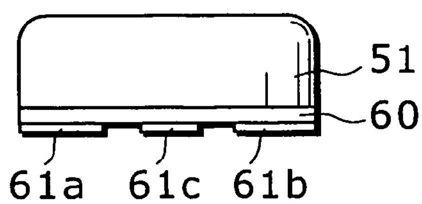
FIG. 8B is a front view diagram showing the external outline of the microphone shown in FIG. 7.
Figure 8C:
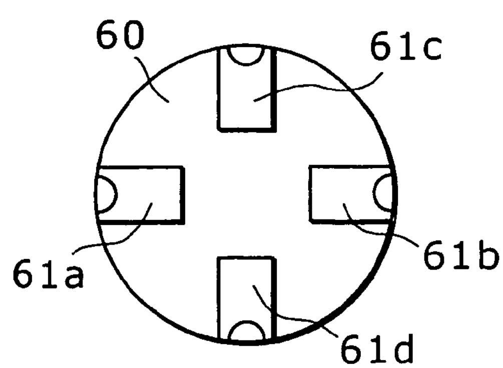
FIG. 8C is a bottom view diagram showing the external outline of the microphone shown in FIG. 7.

FIG. 8 is an external view diagram showing an outline of the microphone 50 shown in FIG. 7. FIG. 8A is a plain diagram, FIG. 8 B is a front view diagram, and FIG. 8C is a bottom view diagram. Size of the lid cover 51 shown in FIG. 8A and FIG. 8B is, for example, approximately $\phi 5$ mm×2 mm in height. Four external electrodes 61_a~_61_d_ shown in FIG. 8C are, for example, two terminals for a power supply and two terminals for an output signal of the electrostatic capacitance detection circuit.

In such a practical example, the capacitor to be detected (the capacitor microphone in the example here) and the electrostatic capacitance detection circuit (the IC chip in the example here) are located adjacently to be in contact side by side under the aforementioned condition for being closely, and they are connected each other by an electric conductor of which length is extremely short. Then, these parts are covered with a shield material such as a metal lid cover. Therefore, in the practical example like this, any negative impacts such as disturbance noise, which is mixed into the signal line (the electric conductor) connecting the impedance to be detected and the electrostatic capacitance detection circuit, can be ignored.

In this practical example, it is preferable that the capacitor to be detected and the electrostatic capacitance detection circuit are connected each other by a non-shielded (unshielded) conductive board, wiring pattern, wire bonding, lead line or the like through a shortest route. That is, in this practical example, since it may be applied to a compact microphone where a shielding material is not used for its signal line, the capacitor to be detected and the electrostatic capacitance detection circuit are connected each other by an extremely short electric conductor, and a special circuit for applying guard voltage to the shield or the like is not located, so that the size of the circuit doesn't get bigger and miniaturization of the circuit is not hindered.

Figure 9:
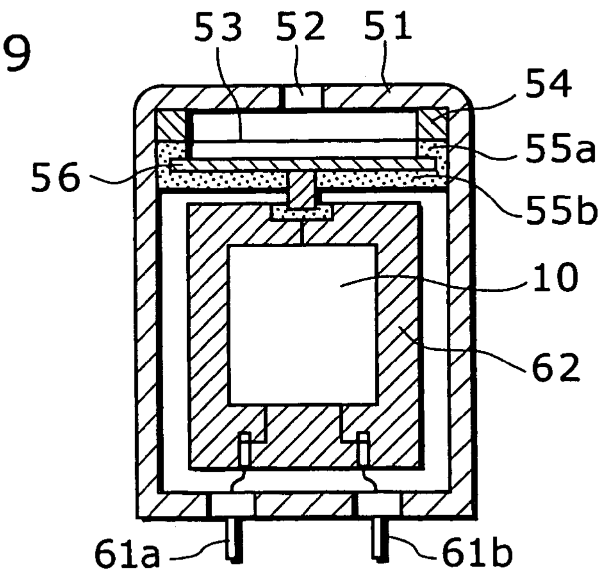
FIG. 9 is a cross section diagram of other example of the microphone.
Figure 10A:
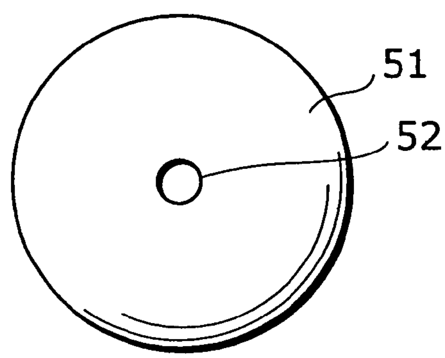
FIG. 10A is a plain diagram showing an external outline of the microphone shown in FIG. 9.
Figure 10B:
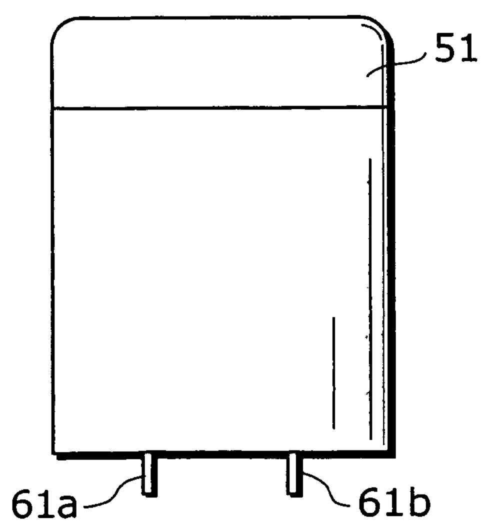
FIG. 10B is a front view showing the external outline of the microphone shown in FIG. 9.

As other example of the microphone, FIG. 9 and FIG. 10 show the circuit put on a board. They are basically the same as the one in FIG. 7 with an exception that the electrostatic capacitance detection circuit is put on a board 62.

When the second embodiment is applied to this practical example, the size of the circuit gets a little bigger for a part of the shield of the signal line. However, this structure may be used since this is rather preferable for more accurate measurement.

Although the impedance detection circuit and the electrostatic capacitance detection circuit according to the present invention have been described based on the two embodiments, the present invention is not limited to these embodiments.

For instance, in the second embodiment, though one layered shield cable is used as a cable to connect the capacitor 17 and the electrostatic capacitance detection circuit 40, two layered shield cable can be used in stead. In this case, the guard voltage is applied to its inner shield covering the signal line, and its outer shield covering the inner shield is connected to the specific potential or the ground, so that a shielding effect against disturbance noise can be enhanced.

Figure 11:
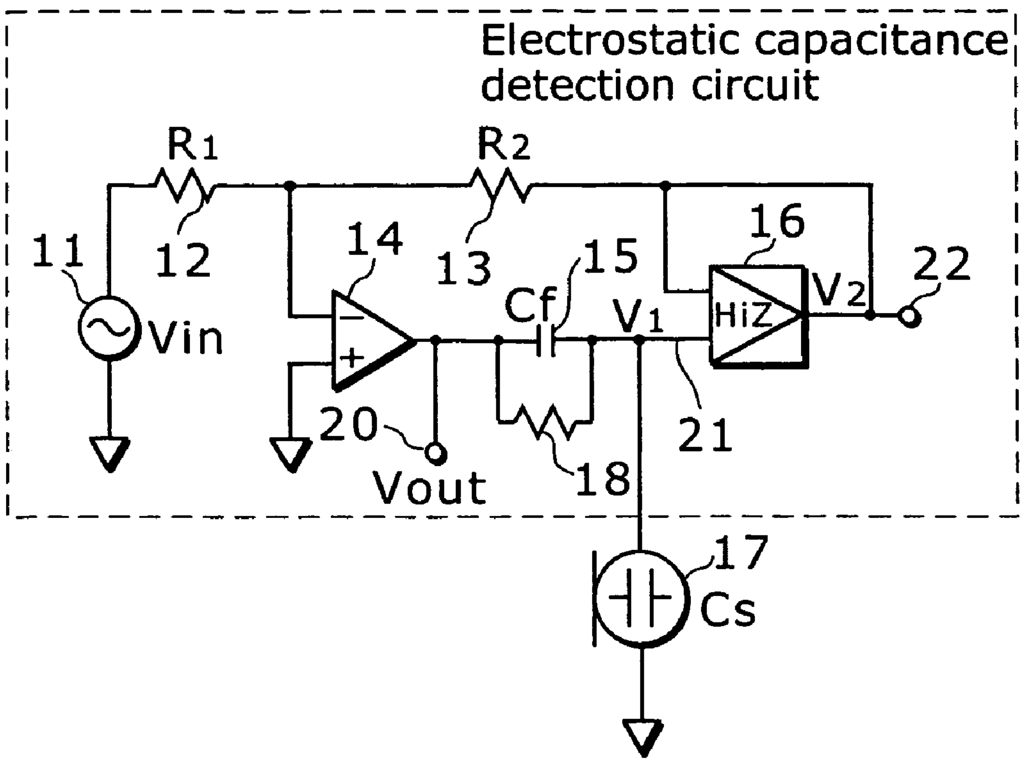
FIG. 11 is a circuit diagram of the electrostatic capacitance detection circuit according to other embodiment of the present invention.

Also, as shown in FIG. 11, it is possible to connect a resistance 18 in parallel with the capacitor 15 in the electrostatic capacitance detection circuits 10 and 30 according to the above embodiments. In this way, a connecting point for the capacitor 15 and the capacitor 17 is connected to the output terminal of the operational amplifier 14 via the resistance 18, so that having a floating status through a DC form can be avoided and the potential can be fixed.

Also, a device connected as the impedance to be connected is not limited to a capacitor microphone and includes all of devices, which detect various physical quantities such as an acceleration sensor, a seismograph, a pressure sensor, a displacement sensor, a proximity sensor, a touch sensor, an ion sensor, a humidity sensor, a raindrop sensor, a snow sensor, a thunder sensor, a placement sensor, a bad contact sensor, a configuration sensor, an endpoint detection sensor, an oscillation sensor, an ultrasonic wave sensor, an angular velocity sensor, a liquid quantity sensor, a gas sensor, an infrared rays sensor, a radiation sensor, a water gauge, a freeze sensor, a moisture meter, a vibrometer, an electrification sensor, a publicly-known capacitive type sensor like a printed circuit board inspection device, or the like.

As has been clarified from the above explanation, by applying DC voltage to the operational amplifier and connecting the impedance to be detected to the signal line, the impedance detection circuit, the electrostatic capacitance detection device and their method according to the present invention detect impedance of the impedance to be detected. That is, the capacitor is connected between the output terminal of the operational amplifier, of which non-inverting input terminal is connected to the specific potential, and the input terminal of the impedance converter, and further the impedance to be detected is connected between the input terminal of the impedance converter and the specific potential.

In this way, most of electric charge sent to the impedance to be detected flows to the impedance element, so that an accurate signal corresponding to the impedance of the impedance to be detected is output to the output terminal of the operational amplifier, which makes it possible to detect very small capacitance. Especially, when each of the impedance is capacitive, it is possible to detect very small capacitance that equals to or is less than a fF order.

Then, because the non-inverting input terminal of the operational amplifier is connected to the specific potential, and the DC voltage is applied to the inverting input terminal via the resistance, the operational amplifier is functioned steadily, and the noise mixed in the detection signal is restrained. Also, as the entire detection circuit is operated by the DC drive and does not require a DC signal transmitter or the like, it can be simplified and miniaturized.

Also, since the capacitor is connected between the operational amplifier and the impedance converter, it does not cause a problem to degrade an S/N ratio due to thermal noise from the resistance when a resistance is connected between the operational amplifier and the impedance converter.

In addition, by placing a circuit element connected to the signal line closely, or placing this impedance detection circuit adjacent to the impedance to be detected, it becomes unnecessary to have a shield cable connecting between them and a special circuit or the like that cancels stray capacitance generated by the cable.

Because a change component, which corresponds to the change in the impedance of the impedance to be detected, is generated at the output terminal of the operational amplifier by extracting only the change component of the output terminal, it realizes an operational amplifier that is best suitable to a capacitive sensor of which capacitance is changed according to the change in the physical quantity of the capacitor microphone or the like. For example, a microphone, which detects sound with extremely high sensitivity, can be realized.

It is also possible to connect one end of the capacitor to be detected and the input terminal of the impedance converter by the signal line covered with a shielding material, and to add the guard voltage applying unit that adds voltage of which potential is the same as that of the voltage of the signal line. In this way, it makes it possible to guard the signal line with the shield at the same potential, and to cancel the stray capacitance generated between the signal line and the shield, so that minuter capacitance can be detected with high accuracy.

As has been mentioned, the present invention realizes an electrostatic capacitance detection circuit or the like, which detects very small impedance and capacitance accurately, and is suitable for miniaturization, and especially sound performance of lightweight and compact audio communication devices such as a mobile phone is rapidly improved and its practical value is extremely high.

INDUSTRIAL APPLICABILITY

The electrostatic capacitance detection circuit according to the present invention may be used as a detection circuit of a capacitance type sensor, especially as a microphone device that is equipped with compact and lightweight devices such as a mobile phone.

What is claimed is:

1. An impedance detection circuit that outputs a detection signal corresponding to impedance of an impedance element to be detected, comprising:

an impedance converter of which input impedance is high and output impedance is low;

a first capacitive impedance element;

a first operational amplifier;

a DC voltage generator that applies DC voltage to the first operational amplifier; and a signal output terminal that is connected to an output of the first operational amplifier, wherein an input terminal of the impedance converter is connected to one end of the impedance element to be detected and one end of the first capacitive impedance element, the first capacitive impedance element and the impedance converter are included in a negative feedback loop of the first operational amplifier, and the impedance element to be detected and the impedance detection circuit are located adjacently.

2. The impedance detection circuit according to claim 1, wherein the impedance element to be detected, the first capacitive impedance element, and the impedance converter are located closely.

3. The impedance detection circuit according to claim 1, wherein the impedance element to be detected is a capacitive impedance element.

4. The impedance detection circuit according to claim 1, further comprising a resistance element connected in parallel with the first capacitive impedance element.

5. The impedance detection circuit according to claim 1, further comprising a second impedance element connected between the DC voltage generator and the first operational amplifier.

6. The impedance detection circuit according to claim 1, wherein the one end of the impedance element to be detected and the input terminal of the impedance converter are connected to each other by a signal line covered with a shielding material, and the impedance detection circuit further includes a guard voltage applying unit that applies a specific voltage to the shielding material.

7. The impedance detection circuit according to claim 6, wherein the guard voltage applying unit receives an output voltage of the DC voltage generator as an input.

8. The impedance detection circuit according to claim 6, wherein the guard voltage applying unit receives an output voltage of the impedance converter as an input.

9. The impedance detection circuit according to claim 1, wherein the impedance converter is a voltage follower.

10. The impedance detection circuit according to claim 1, wherein the impedance converter is a voltage amplification circuit that includes a second operational amplifier and has a voltage gain bigger than one.

11. The impedance detection circuit according to claim 1, wherein the impedance converter includes an input circuit composed of a MOSFET and a second operational amplifier.

12. The electrostatic capacitance detection circuit according to claim 1, wherein the impedance element to be detected is a capacitive sensor of which capacitance is changed temporally, and the first capacitive impedance element is a capacitor.

13. The electrostatic capacitance detection circuit according to claim 12, wherein the impedance element to be detected is a capacitor microphone.

14. An impedance detection method that outputs a detection signal corresponding to impedance of an impedance element to be detected, comprising steps for:

connecting a first capacitive impedance element between an output terminal of an operational amplifier and an input terminal of an impedance converter;

connecting the first capacitive impedance element and the impedance converter in a negative feedback loop of the operational amplifier;

connecting the impedance element to be detected between the input terminal of the impedance converter and a specific potential;

applying DC voltage to one input terminal of the operational amplifier via a resistance, and other input terminal of the operational amplifier is connected to the specific potential;

outputting voltage outputted at the output terminal of the operational amplifier as a detection signal; and connecting the impedance element to be detected, the impedance converter and the first capacitive impedance element closely.

15. The impedance detection method according to claim 14, wherein one end of the impedance element to be detected and the input terminal of the impedance converter are connected to each other by a signal line covered with a shielding material, and a specific voltage is applied to the shielding material.

* * * * *